US010383260B2

United States Patent
Audemar

(10) Patent No.: US 10,383,260 B2
(45) Date of Patent: Aug. 13, 2019

(54) POWER MODULE WITH COOLING SYSTEM FOR ELECTRONIC CARDS

(71) Applicant: ALSTOM Transport Technologies, Saint-Ouen (FR)

(72) Inventor: Christophe Audemar, Horgues (FR)

(73) Assignee: ALSTOM Transport Technologies, Saint-Ouen (FR)

( * ) Notice: Subject to any disclaimer, the term of this patent is extended or adjusted under 35 U.S.C. 154(b) by 0 days.

(21) Appl. No.: 15/901,364

(22) Filed: Feb. 21, 2018

(65) Prior Publication Data

US 2018/0249591 A1     Aug. 30, 2018

(30) Foreign Application Priority Data

Feb. 28, 2017  (FR) ...................................... 17 51602

(51) Int. Cl.
| | |
|---|---|
| H05K 7/20 | (2006.01) |
| H01L 23/367 | (2006.01) |
| H01L 25/16 | (2006.01) |
| H05K 1/02 | (2006.01) |

(52) U.S. Cl.
CPC ......... *H05K 7/209* (2013.01); *H01L 23/3672* (2013.01); *H01L 25/162* (2013.01); *H05K 1/0203* (2013.01); *H05K 7/20518* (2013.01); *H05K 2201/062* (2013.01)

(58) Field of Classification Search
None
See application file for complete search history.

(56) References Cited

U.S. PATENT DOCUMENTS

| | | | | | |
|---|---|---|---|---|---|
| 4,177,499 | A | * | 12/1979 | Volkmann | H05K 7/209 361/690 |
| 5,168,348 | A | * | 12/1992 | Chu | H01L 23/367 257/713 |
| 6,320,776 | B1 | * | 11/2001 | Kajiura | H02M 7/003 361/709 |
| 6,849,943 | B2 | * | 2/2005 | Thurk | H02M 1/44 257/675 |

(Continued)

FOREIGN PATENT DOCUMENTS

| | | |
|---|---|---|
| EP | 2 658 359 A2 | 10/2013 |
| EP | 2 861 048 A1 | 4/2015 |

OTHER PUBLICATIONS

French Search Report issued for French Application No. FR 17 51602 dated Nov. 13, 2017.

*Primary Examiner* — Courtney L Smith
(74) *Attorney, Agent, or Firm* — Pearne & Gordon LLP

(57) ABSTRACT

The application relates to a power module (10) including: pieces of electrical equipment (12), at least first (14) and second (16) electronic cards, and a cooling device (20), able to discharge the heat given off by the pieces of electrical equipment and electronic cards. The cooling devices include first (34) and second (36) surfaces thermally insulated from one another, the pieces of electrical equipment (12) being in thermal contact with the first surface and separated from the second surface. The first electronic card (14) is fastened to a piece of electrical equipment (12) and thermally connected to the second surface (36) of the cooling device by a heat sink (42). The second electronic card (16) is positioned close to the second surface (36), or in contact with the second surface.

9 Claims, 1 Drawing Sheet

(56) References Cited

U.S. PATENT DOCUMENTS

| | | | |
|---|---|---|---|
| 8,189,324 B2* | 5/2012 | Folts | H01L 23/4006 |
| | | | 257/718 |
| 9,612,629 B2* | 4/2017 | Hirano | G06F 1/181 |
| 9,668,334 B2* | 5/2017 | Refai-Ahmed | H05K 1/0203 |
| 9,883,612 B2* | 1/2018 | Achard | H05K 7/20409 |
| 10,147,666 B1* | 12/2018 | Trimberger | H01L 23/467 |
| 2011/0012255 A1* | 1/2011 | Suganuma | H01L 23/3675 |
| | | | 257/712 |
| 2011/0181105 A1 | 7/2011 | Michinaka et al. | |
| 2011/0188207 A1* | 8/2011 | Won | G06F 1/20 |
| | | | 361/709 |
| 2016/0019937 A1* | 1/2016 | Arora | G11C 7/04 |
| | | | 365/163 |
| 2016/0278211 A1* | 9/2016 | Feng | H05K 1/144 |

* cited by examiner

POWER MODULE WITH COOLING SYSTEM FOR ELECTRONIC CARDS

This application claims priority from French Patent Application No. 17 51602 filed on Feb. 28, 2017. The content of this application is incorporated herein by reference in its entirety.

BACKGROUND

The present invention relates to a power module of the type including: pieces of electrical equipment, at least first and second electronic cards, and a cooling device, able to discharge the heat given off by said pieces of electrical equipment and electronic cards.

The pieces of electrical equipment of the power modules, such as IGBT packs, may give off significant heat during operation. Power modules are therefore typically equipped with cooling devices, as for example described in document US2011/0181105.

The electronic control cards of pieces of electrical equipment are typically sensitive to high temperatures. In order for said cards to withstand the heat emitted by the components of the module, the typical technical solutions consist of adapting the technology of said cards so that the latter remain functional at high temperatures.

The present invention aims to propose a configuration of the module that protects the electronic cards from the highest temperatures, which makes it possible to extend their lifetime while using less expensive technologies.

To that end, the invention relates to a power module of the aforementioned type, wherein: the cooling devices include first and second surfaces thermally insulated from one another, the pieces of electrical equipment being in thermal contact with the first surface and separated from the second surface; the first electronic card is fastened to a piece of electrical equipment, said first electronic card being thermally connected to the second surface of the cooling device by a heat sink; and the second electronic card is positioned close to the second surface of the cooling device or in contact with said second surface.

According to other aspects of the invention, the power module includes one or more of the following features, considered alone or according to any technically possible combination(s):
- the first and second surfaces of the cooling device are substantially coplanar;
- the cooling device includes: a cooling panel, a first face of said panel forming the first and second surfaces of the cooling device; and ventilation fins, fastened to a second face of the cooling panel;
- each of the first and second surfaces is made from a thermally conducting material, the cooling panel further including a strip of thermally insulating material, separating said first and second surfaces;
- the cooling panel includes at least one slit separating the first and second surfaces, said first and second surfaces being connected to one another at the ends of said slit;
- the heat sink includes a strip of a thermally conducting material, first and second ends of said strip being in thermal contact, respectively with the first electronic card and with the second surface;
- a thermal contact between the first electronic card and the first end of the heat sink is provided by a layer of thermally conductive paste or foam;
- the power module includes at least one thermally insulating wall positioned between the second electronic card and a piece of electrical equipment;
- a face of the thermally insulating wall, oriented toward the piece of electrical equipment, is covered by a layer of material deflecting infrared radiation.

The invention will be better understood upon reading the following description, provided solely as a non-limiting example and done in reference to the drawings, in which:

FIG. 1 shows a power module 10 according to a first embodiment of the invention. FIG. 2 partially shows a power module 110 according to a first embodiment of the invention.

Figure 1:
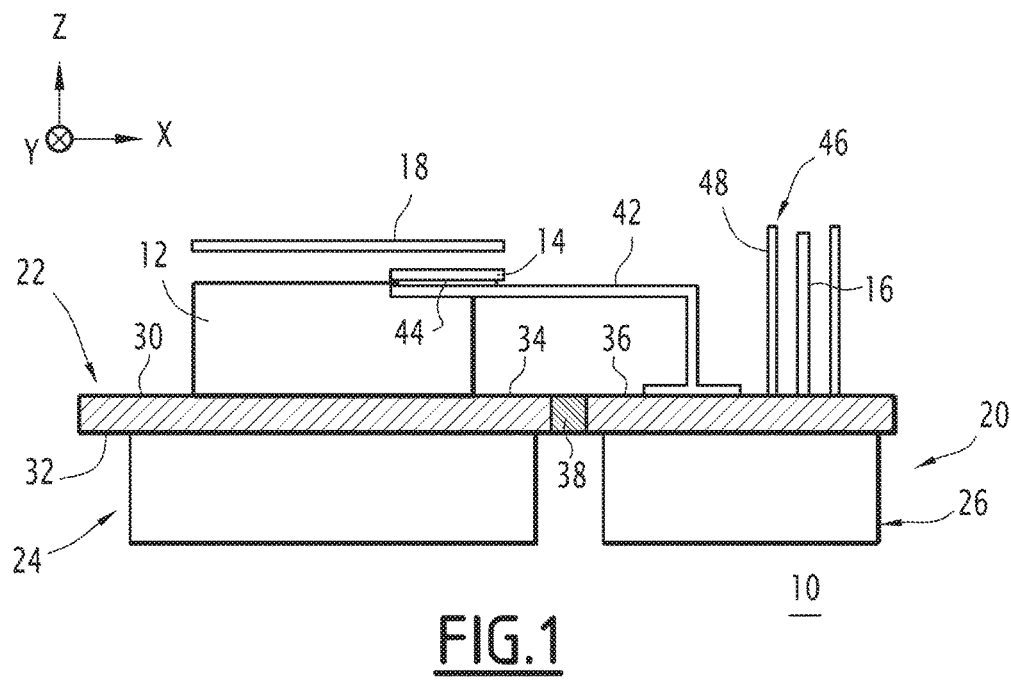
FIG. 1 is a sectional schematic view of a power module according to a first embodiment of the invention.

The power modules 10 and 110 are described at the same time, the shared elements being designated using the same reference numbers.

The power module 10, 110 comprises pieces of electrical equipment 12 and at least first 14 and second 16 electronic cards. The power module 10, 110 further comprises a busbar 18. The electronic cards 14, 16 and the busbar 18 are not shown in FIG. 2.

The power module 10, 110 further comprises a cooling device 20, 120, able to discharge heat given off by the pieces of electrical equipment 12 and the electronic cards 14, 16.

The pieces of electrical equipment 12 are of the power electronic component type, such as IGBT (isolated gate bipolar transistor) components. The pieces of electrical equipment 12 are in particular able to give off significant heat during operation.

The electronic cards 14, 16, shown schematically in FIG. 1, traditionally comprise a support and a plurality of electronic components connected to said support. The electronic components are also able to give off heat during operation. Furthermore, these electronic components are generally sensitive to high temperatures.

Figure 2:
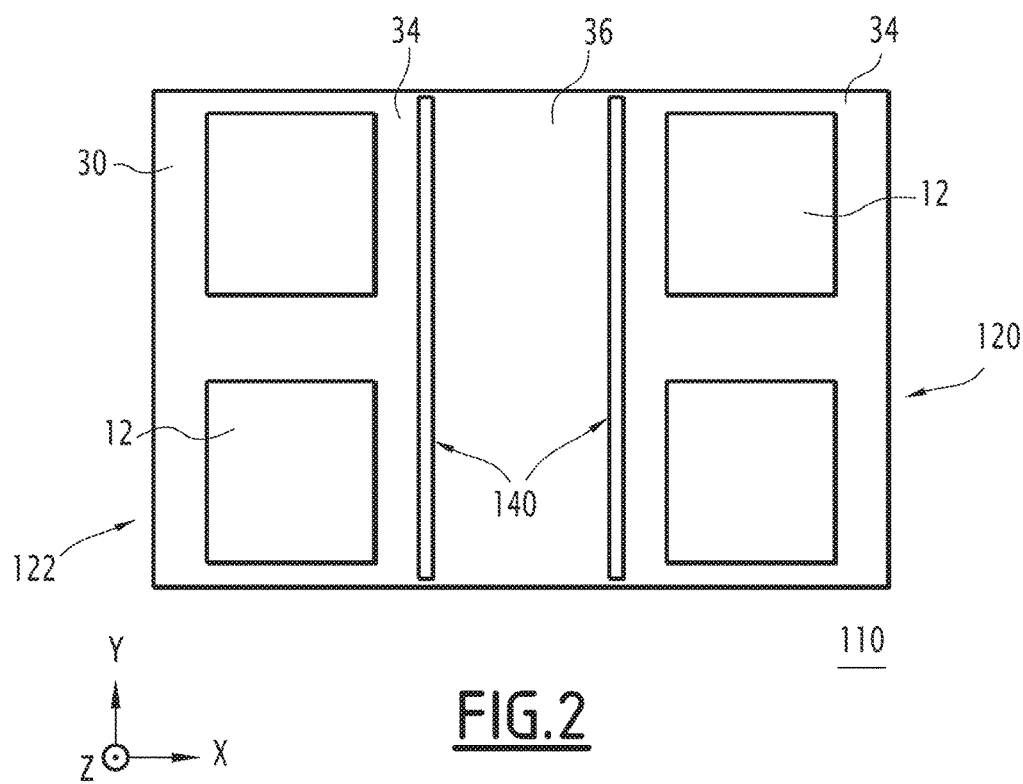
FIG. 2 is a partial schematic view of a power module according to a second embodiment of the invention.

In the embodiments of FIGS. 1 and 2, the cooling device 20, 120 is of the cooling fins type. More specifically, the cooling device 20, 120 includes a cooling panel 22, 122 and cooling fins 24, 26. Said fins 24, 26 are not shown in FIG. 2.

The cooling panel 22, 122 is substantially planar. An orthogonal base (X, Y, Z) is considered, the cooling panel 22, 122 being substantially positioned in a plane (X, Y).

The cooling panel 22, 122 includes first 30 and second 32 faces. The cooling fins 24, 26 are fastened to said second face 32.

The first face 30 of the cooling panel 22, 122 includes a first surface 34, called "hot zone", and a second surface 36, called "cold zone". The first 34 and second 36 surfaces are thermally insulated from one another.

In the embodiment of FIG. 1, each of the first 34 and second 36 surfaces is made from a thermally conducting material, and the cooling panel 22 further includes a strip 38 of thermally insulating material, separating said first 34 and second 36 surfaces. Furthermore, the fins 24, 26 form two groups situated separated from one another. A first group of fins 24 is fastened to the first surface 34, and a second group of fins 26 is fastened to the second surface 36. Preferably, each group of fins 24, 26 is made in one piece with the surface 34, 36 of the panel to which it is fastened.

In the embodiment of FIG. 2, the cooling panel 122, shown in top view, is made in one piece. Said panel is in the form of a rectangle, the sides of which extend in the directions X and Y. The first surface 34 includes two parts situated at the ends of the panel along X, the second surface 36 being positioned between said two parts. The cooling panel 122 includes two slits 140 extending along Y and separating the second surface 36 from each part of the first surface 34. Said first 34 and second 36 surfaces are nevertheless connected to one another at the ends of the slits 140.

In an alternative that is not shown, it is possible to assemble two radiators mechanically with a non-conducting joint in the middle.

The pieces of electrical equipment 12 are fastened to the first surface 34, in thermal contact with said first surface, called "hot zone". The second surface 36, called "cold zone", is not in contact with the pieces of electrical equipment 12. Said second surface 36 is used specifically to cool the electronic cards 14, 16 in order to guarantee them protection against high temperatures.

More specifically, for functional reasons, the first electronic card 14 is positioned near a piece of electrical equipment 12. As shown in FIG. 1, said first electronic card 14 is therefore fastened to said piece of electrical equipment.

The busbar 18, or set of bars, is an electrical conductor and is brought to high temperatures. The busbar 18 is positioned above the first electronic card 14, near said card.

The first electronic card 14 is thermally connected to the second surface 36 of the cooling panel 22, 122, by a heat sink 42. The heat sink 42 is for example made up of a strip of a thermally conducting material, first and second ends of said strip being in thermal contact, respectively with the first electronic card 14 and with the second surface 36. The heat sink 42 is for example made from copper or aluminum.

The thermal contact between the first electronic card 14 and the heat sink 42 is for example provided by a layer 44 of thermally conductive paste or foam, of the "gap pad" type.

Optionally, between its two ends, the heat sink 42 is covered by a thermally insulating sheath with respect to convection and/or radiation. Optionally, a sheet of graphite is glued on the heat sink 42 in order to reinforce the thermal conduction between the first electronic card 14 and the second surface 36.

It is considered that the second electronic card 16 has functions allowing it to be located at a distance from the pieces of electrical equipment 12. Said second electronic card 16 is therefore positioned close to, or fastened to, the second surface 36 of the cooling panel 22, 122.

Optionally, the module 10, 110 includes at least one thermally insulating wall 46, positioned between the second electronic card 16 and a piece of electrical equipment 12. Preferably, a face 48 of said wall, oriented toward the piece of electrical equipment 12, is covered by a layer of material deflecting infrared radiation.

If the module 10, 110 includes a thermally insulating wall 46, it is not necessary to provide physical contact between the second electronic card 16 and the second surface 36. Indeed, the air surrounding the second electronic card 16 is cooled by the second surface 36 and remains at least partially isolated from the air surrounding the first electronic card 14, which provides a cooler environment for the second electronic card 16.

An operating method of the module 10, 110 will now be described. The operating pieces of electrical equipment 12 give off significant heat. This heat is diffused in the panel 22, 122 at the first surface 34, then is discharged by the fins 24. Part of this heat contributes, however, by radiation and/or convection, to heating the air surrounding the first electronic card 14. During the operation of the pieces of electrical equipment 12, the first surface 34, called "hot zone", has a higher temperature than the second surface 36, called "cold zone".

Furthermore, the busbar 18, positioned above the first electronic card 14, creates a hot air confinement around said card.

The thermal contact between said second surface 36 and the first 14 and second 16 electronic cards, as described above, makes it possible to cool said electronic cards 14, 16 effectively. The second electronic card 16 is further protected from the thermal radiation of the pieces of electrical equipment 12 by the thermally insulating wall 46.

The exposure of the electronic cards 14, 16 to the heat emitted by the pieces of electrical equipment 12 is thus limited, which protects the lifetime of said cards.

The invention claimed is:

1. A power module, comprising:
pieces of electrical equipment,
at least first and second electronic cards, and
a cooling device, able to discharge heat given off by said pieces of electrical equipment and electronic cards;
wherein:
the cooling devices include first and second surfaces thermally insulated from one another, the pieces of electrical equipment being in thermal contact with the first surface and separated from the second surface;
the first electronic card is fastened to a piece of electrical equipment, said first electronic card being thermally connected to the second surface of the cooling device by a heat sink; and
the second electronic card is positioned close to the second surface of the cooling device or in contact with said second surface.

2. The power module according to claim 1, wherein the first and second surfaces of the cooling device are substantially coplanar.

3. The power module according to claim 2, wherein the cooling device includes:
a cooling panel, a first face of said panel forming the first and second surfaces of the cooling device; and
ventilation fins, fastened to a second face of the cooling panel.

4. The power module according to claim 3, wherein each of the first and second surfaces is made from a thermally conducting material, the cooling panel further including a strip of thermally insulating material, separating said first and second surfaces.

5. The power module according to claim 3, wherein the cooling panel includes at least one slit separating the first and second surfaces, said first and second surfaces being connected to one another at the ends of said slit.

6. The power module according to claim 1, wherein the heat sink includes a strip of a thermally conducting material, first and second ends of said strip being in thermal contact, respectively with the first electronic card and with the second surface.

7. The power module according to claim 6, wherein a thermal contact between the first electronic card and the first end of the heat sink is provided by a layer of thermally conductive paste or foam.

8. The power module according to claim 1, including at least one thermally insulating wall positioned between the second electronic card and a piece of electrical equipment.

9. The power module according to claim 8, wherein a face of the thermally insulating wall, oriented toward the piece of electrical equipment, is covered by a layer of material deflecting infrared radiation.

* * * * *